United States Patent [19]

Babini

[11] Patent Number: 5,150,094
[45] Date of Patent: Sep. 22, 1992

[54] FUSE BLOCK, PARTICULARLY FOR PRINTED CIRCUITS

[75] Inventor: Ezio Babini, Zola Predosa, Italy

[73] Assignee: Fittings For Industry S.r.l., Bologna, Italy

[21] Appl. No.: 707,795

[22] Filed: May 30, 1991

[30] Foreign Application Priority Data

May 31, 1990 [IT]  Italy .................... 4836/90[U]

[51] Int. Cl.[5] .................... H01R 13/68; H02B 1/18
[52] U.S. Cl. .................... 337/214; 337/186; 439/621
[58] Field of Search .................... 337/186–188, 337/190, 194, 198, 201, 205, 208–211, 213, 214, 216; 439/620, 621, 622; 361/400, 405, 430, 432

[56] References Cited

U.S. PATENT DOCUMENTS

| 4,268,106 | 5/1981 | Moerre | 439/621 |
|---|---|---|---|
| 4,679,877 | 7/1987 | Ahroni | 439/425 |
| 4,926,110 | 5/1990 | Yoon | 439/621 |
| 4,938,715 | 7/1990 | Jones | 439/621 |
| 5,002,505 | 3/1991 | Jones | 337/213 |

FOREIGN PATENT DOCUMENTS

| 1963648 | 6/1971 | Fed. Rep. of Germany . |
|---|---|---|
| 7930161 | 2/1980 | Fed. Rep. of Germany . |
| 2160247 | 6/1973 | France . |
| 2348560 | 11/1977 | France . |
| 2146184 | 4/1985 | United Kingdom . |

*Primary Examiner*—Gerald P. Tolin
*Attorney, Agent, or Firm*—Darby & Darby

[57] ABSTRACT

A fuse block, particularly for printed circuits, consists of a small block of insulating material, having a "U" shape, to whose wings are locked two equal terminals, provided at the bottom with a coupling for printed circuit and at the top with two prongs designed to receive a head of a fuse, restrained by a small frame. From the small frame extend two wings shaped in such a way as to allow the easy insertion between themselves of the fuse and the subsequent elastic restraint of the fuse.

9 Claims, 1 Drawing Sheet

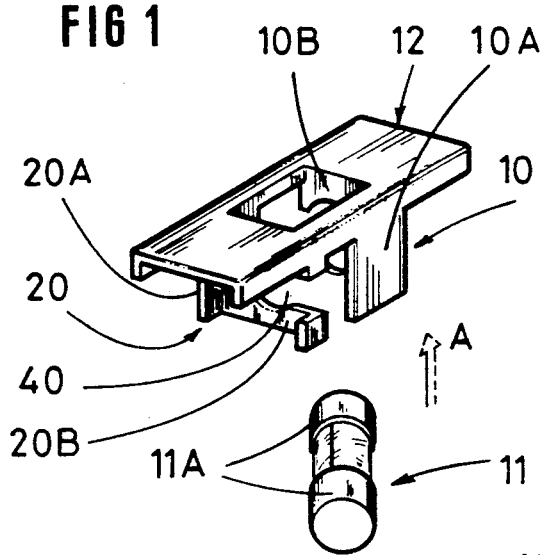
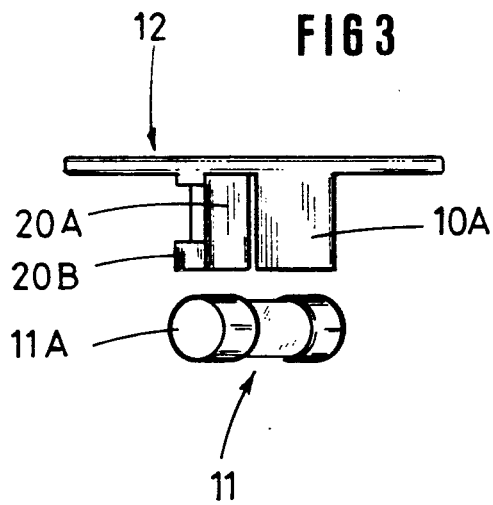
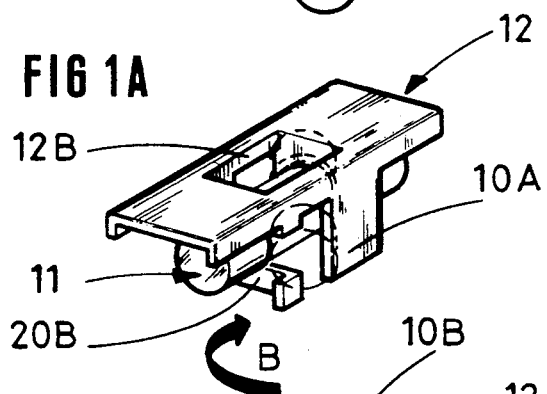
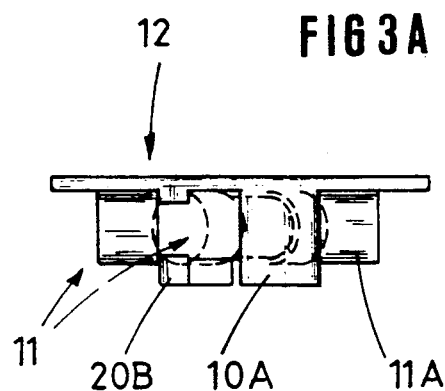
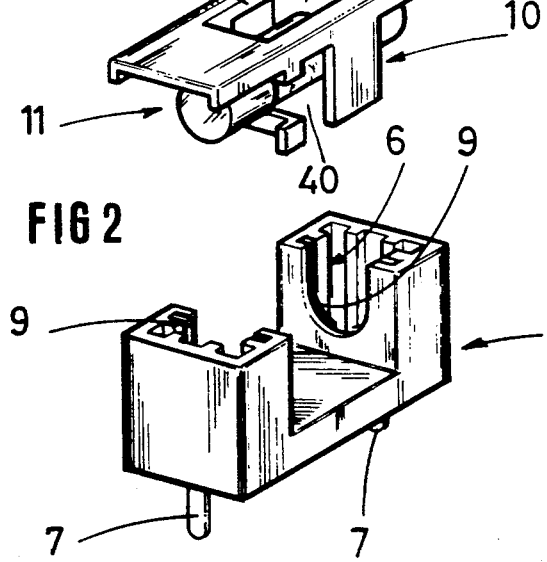
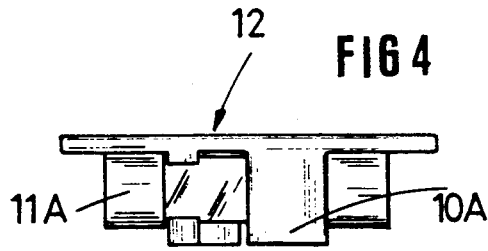
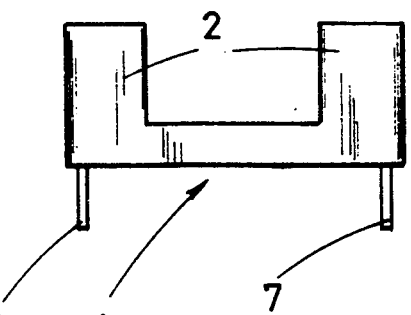

FUSE BLOCK, PARTICULARLY FOR PRINTED CIRCUITS

BACKGROUND OF THE INVENTION

This invention relates to an improvement made on a fuse block for printed circuits.

DESCRIPTION OF THE PRIOR ART

It is known that fuse blocks for printed circuits are required to be functional and reliable as well as to have a low manufacturing cost.

Fuse blocks designed for the particular technical field mentioned above are already known, e.g. consisting of a small insulating block of synthetic resin, having a "U" shape, with the wings of said "U" in tubular form.

To said block are fastened two equal metal terminals, each of them shaped at the bottom according to a coupling suited to be inserted into a corresponding seating of the printed circuit, and defining, at the top, two prongs designed to receive between themselves, by snap insertion, an end of the fuse, the fuse ends are supported by a relatively small frame.

It is known that the small frame, having a "T" shape, comprises a cylindrical seating disposed longitudinally to the same small frame, suited to receive a fuse, through the initial disposition of this latter coaxially to said seating and to the subsequent pressure exerted on the fuse in the direction of the longitudinal axis of the above-mentioned seating.

It is also known that said fuse is assembled on the small frame by hand.

The result is a remarkable incidence of said manufacturing phase on the total cost of the whole fuse block (small block, small frame, fuse).

The most part of the time employed for such operation of fuse-frame assembling is due to the difficulty of coupling these latter parts manually.

It is also known that, when testing equipment employing such fuse blocks, a remarkable number of fuses often result to be damaged.

This is followed by the need to provide, also manually, for the replacement of the fuses inserted in the small frames; thus it is obvious that the time required and consequently the costs related to this series of operations increase substantially.

SUMMARY OF THE INVENTION

While maintaining the validity and the practicality of the above-mentioned small blocks of synthetic resin, having a "U" shape, with the wings of said "U" in tubular form in order to receive the ends of the fuse, the main feature of the present invention consists in improving the practical (thus economic) aspect concerning the assembly of said fuse-small frame group, with the first one suited to be coupled with said small block.

The above-mentioned feature is accomplished by means of a fuse block, particularly for printed circuits, said fuse block of: a small insulating block having a "U" shape, with wings fitted with two metal terminals, shaped at bottom according to a vertical coupling suited to be inserted into a corresponding seating of said printed circuit, and at top according to two vertical prongs designed to receive, by snap insertion, a head of a fuse; a small frame, designed to hold said fuse, said small frame having a "T" shape, said fuse being elastically restrained to a lower face of a base of said small frame, through removable locking means in a single body with said base; said locking means are placed in a central position of said small frame and comprising at least two wings defining seatings to receive and elastically restrain said fuse.

BRIEF DESCRIPTION OF THE DRAWINGS

The features of the present invention will be described further hereinafter, with particular reference to the accompanying drawing, wherein:

FIG. 1 is an exploded perspective view of the small frame and of the fuse;

FIG. 1A is a perspective view of the fuse-small frame unit assembled;

FIG. 2 is an exploded perspective view of the complete fuse block;

FIG. 3 is an exploded lateral view of the small frame and of the fuse;

FIG. 3A is a lateral view of the small frame-fuse group assembled;

FIG. 4 is an exploded lateral view of the complete fuse block.

DESCRIPTION OF THE PREFERRED EMBODIMENT

With reference to said figures and particularly to FIGS. 1 and 3, the numeral 12 designates a small frame basically having a "T" shape, suited to hold a fuse 11.

Said small frame 12 is provided with "L"-shaped wings 10 and 20, consisting of respective sides 10A, 20A and appendices 10B, 20B, with these latter parallel to the upper part of said small frame 12. The wings are elastic to lock properly said fuse 11 in its seating (as indicated in FIGS. 1 and 1A). Said wings have, the same shape but are directed in opposite directions with respect to the transverse axis of the small frame.

Said wings 10 and 20 are offset to define relative openings, respectively provided between the side 10A and the appendix 20B, and between the side 20A and the appendix 10B, which together provide a seating 40 oriented along the length of the axis of said small frame. Said fuse 11 is assembled to said small frame 12 by inserting the fuse into the seating 40 mentioned above, laying it diagonally in the space between the two appendices 10A, 10B, as indicated by arrow A in FIG. 1.

At this point, a semi-rotation is sufficient, as, indicated by arrow B of FIG. 1A, to insert said fuse 11 into the resilient wings of said frame 12 very quickly to be held thereby.

This latter is provided, at the top, with a window 12B which makes it possible, at any moment, to verify the correct operation of said fuse 11, particularly when this latter is inserted into the frame.

The conducting heads 11A of said fuse protrude from said wings 10 and 20, but remain covered by the upper part of said small frame 12.

With reference to FIGS. 2 and 4, the numeral 1 designates a small block of synthetic resin having a "U" shape, provided with two wings 2 provided with special hollows into which are inserted, by a known method, two metal terminals 6, each of them having two vertical prongs 9 suited to receive said conducting heads 11A of the fuse 11.

The resilience of said prongs 9 allows an adequate fastening of the conducting heads 11A of the fuse 11 when this latter is inserted into said prongs 9, thus ensuring a safe reliable electric connection.

The mutual assembly between the heads 11A and said prongs 9 of said terminals 6 is quick and easy, and it may be carried out by light pressure of the unit comprising the small frame 12 and the fuse 11 on the small block 1.

Furthermore, every terminal 6 is shaped, at the bottom, with a pin terminal 7 suited to be inserted into a corresponding socket or terminal pod hole seating of the printed circuit.

Obviously, the surface area of mutual contact among said terminals 6 and said heads 11A is a function of the maximum rated current of the fuse 11.

The particular, and original, confirmation of the technical solution provided by the present invention (i.e. the wings 10 and 20 of the small frame 12) makes it possible to obtain, on the one hand, the same elements through simple technological operations (by molding of synthetic resin) and, on the other hand, a simple and quick insertion of said fuse into said small frame 12.

As a result, a very functional article is obtained, both from the point of view of manufacture, with a substantial reduction of relative costs, and from the user's point of view; the highest reliability of operation is also assured.

It is understood that the above has been described by way of example and it is not restrictive, therefore any possible variation of practical-applicative nature of constructional details (e.g. dimensions of fuse blocks, as well as dimensions of terminals 6, etc.) are understood as covered by the technical solution as described above and claimed hereinafter.

What is claimed is:

1. A holder for a cartridge type fuse having a body and a conductor at each end, comprising:
    a frame member having a longitudinal axis and a transverse axis, said frame being longer along the longitudinal axis;
    a pair of L-shaped wings, each wing having an arm with one end attached to one surface of the frame member and a transversely extending finger at the other end thereof, said wings spaced on opposite sides along the length of the frame member with the fingers thereof spaced from the frame oppositely transversely directed toward opposite longitudinal sides of the frame, a fuse inserted by being placed oblique to the longitudinal axis of said frame and rotated into the opposite open sides of the wings and held on said fingers.

2. A holder as in claim 1 wherein each said wing is of resilient material and the fuse is held therebetween by a friction fit.

3. A holder as in claim 2 wherein the finger of each wing has a cutout portion receiving the body of the fuse.

4. A holder as in claim 1 wherein the fingers are spaced apart by a distance such that the conductive ends of the fuse extend outwardly thereof.

5. A holder as in claim 4 further comprising a block receiving the frame with the fuse therein, said block having a conductive terminal at each end for receiving the conductor end of the fuse.

6. A holder as in claim 5 wherein there is a force fit relationship between the frame and the block.

7. A holder as in claim 5 wherein each said wing is of resilient material and the fuse is held therebetween by a friction fit.

8. A holder as in claim 7 wherein each said wing is of resilient material and the fuse is held therebetween by a friction fit.

9. A holder as in claim 5 wherein the fingers are spaced apart by a distance such that the conductor ends of the fuse extend outwardly thereof.

* * * * *